United States Patent [19]
Kadija

[11] Patent Number: 5,114,558
[45] Date of Patent: May 19, 1992

[54] METHOD AND APPARATUS FOR MANUFACTURING INTERCONNECTS WITH FINE LINES AND SPACING

[76] Inventor: Igor V. Kadija, 118 Sherwood Rd., Ridgewood, N.J. 07450

[21] Appl. No.: 688,257

[22] Filed: Apr. 22, 1991

Related U.S. Application Data

[62] Division of Ser. No. 311,212, Feb. 15, 1989.

[51] Int. Cl.⁵ .............................................. C25D 17/14
[52] U.S. Cl. ...................................... 204/224 R
[58] Field of Search .................... 204/224 R

[56] References Cited

U.S. PATENT DOCUMENTS

| | | | |
|---|---|---|---|
| 4,159,934 | 7/1979 | Kadija | 204/224 R |
| 4,417,962 | 11/1983 | Inoue | 204/129.46 |

FOREIGN PATENT DOCUMENTS

| | | |
|---|---|---|
| 61040 | 5/1979 | Japan . |
| 169798 | 12/1981 | Japan . |
| 297588 | 12/1988 | Japan . |

*Primary Examiner*—T. M. Tufariello
*Attorney, Agent, or Firm*—Kenyon & Kenyon

[57] ABSTRACT

Metallic or non-metallic wires or bristles are attached to a hollow, cylindrical core. The wires or fibers are quite fine in diameter. Space is provided in the core in the shape of perforations for the transfer of electrolyte, which is fed from the hollow inner portion of the cylinder, along the fibers, to the copper substrate on an imaged substrate.

Electrical or non-electrical sources are employed. The wires may be electrically connected through the metal cylinder to the positive pole (anode) of the DC power source. The non-conductive fibers make direct contact with the metal to be etched. In the electrical device within the hollow cylinder but separated from the cylinder is positioned a perforated or mesh copper, which is connected electrically to the negative pole (cathode) of the DC power supply. A cell is now made between the copper laminate and the perforated copper inside the cylinder. Copper from the laminate (anode) is removed and deposited on the perforated copper (cathode).

The same apparatus is used for electroforming applications. The wires can be connected to the negative pole of the rectifier, while an anodically insoluble conductive substrate can be used in place of the counter-electrode within the hollow cylinder. By contacting an activated or metallic substrate with negatively charged fibers one can deposit metal in the exposed areas.

12 Claims, 3 Drawing Sheets

METHOD AND APPARATUS FOR MANUFACTURING INTERCONNECTS WITH FINE LINES AND SPACING

This application is a division, of application Ser. No. 07/311,212, filed Feb. 15, 1989.

BACKGROUND OF THE INVENTION

1. Field of the Invention

This invention relates to methods and apparatus for fabrication of fine line and space interconnections in electronic packaging. The invention is in particular applicable for printed circuit boards (PCB), tape automated bonding (TAB) systems and other electronic devices with the need for fine line and space interconnects.

The technical content of PCBs are based on three aspects: density of the electronic circuitry, number of layers, and the quality of material used in lamination of the boards. This invention relates to the first aspect, the density of the board. Density is determined by the relative proximity of the electrically active elements and their number per unit area of the board. The elements that constitute the majority of electrical elements on the board are the copper conductor lines. Hence, the density of the PCB is dependent upon the lateral spacing of the conductor lines and their width.

2. Description of the Prior Art

The trend towards finer lines and decreasing interline spacing has been strong in recent years, and will continue into the future. There have been several particles on this subject. In the article "Shrinking Semiconductors", *PC Fabrication*, May 1988, R. W. Allison, Jr. and others state that "a steadily decreasing IC line width increases the number of connections to be made on package/board interface. These require an increase in PCB line density and the number of layers in the board." In concurrence with the great majority of authorities in the field they conclude that PCBs with 2 mil-lines will become the standard in the industry in the early 1990s.

In the June 1987 edition of *Printed Circuit Fabrication*, Vol. 10, No. 6, at pages 37-44, an article by R. D. Rust, entitled "Fine Line Technology: The Impact of Dry Plasma Processing", discusses the supplanting of the wet chemical processes by dry plasma processes for printed circuit fabrication. One of the issues noted by Rust is the need for generation of fine line features of less than four mils. Rust notes that photolithographic resolution is not the limiting process in generating these features; rather, the subsequent processes of developing, etching or plating are the limiting processes.

Conventional printed circuit boards are manufactured in the following manner: the process consists of first joining epoxy and copper laminates by heat and pressure. The epoxy laminate is much thicker than the copper laminate as it provides the mechanical support. Application of heat and pressure causes the epoxy to soften and bond to the copper laminate. The copper surface is either chemically treated, or electrochemically with dendritic treatment, both of which produce a jagged surface on a microscopic scale, which promotes adhesion.

Photo-resist is then applied on the copper surface. Liquid photo-resist application has been replaced lately by 'dry' photo-resist methods. In the dry photo-resist technique, a photo-resist film is laminated on the copper again by heat and pressure.

The conductor pattern is then 'exposed' on the photo-resist. The exposed board is 'developed' in an appropriate chemical solution that dissolves the photo-resist, consequently exposing the copper surface along the area which needed to be etched in the following 'copper etching' operation.

In the copper etching operation, the developed board is passed through a chemical spray chamber, where jets spray chemicals which dissolve copper. The photo-resist and the copper etching solution have been so chosen that the chemicals only attack copper and not the photo-resist. At the conclusion of the copper etching process a well defined conductor pattern with an overlay of photo-resist is left on the epoxy substrate.

The photo-resist overlay is then etched away by another chemical solution which only etches the photo-resist and not the copper.

In printed wiring board manufacturing involving 'multi-layers', i.e. boards containing several layers of alternate copper conductors and epoxy laminates, interconnection between the copper conductors on different levels is necessary. That is accomplished by drilling holes at the appropriate levels and depositing copper in the holes, with a prior treatment which assures adhesion of the deposited copper to the epoxy sidewalls.

This etching technology employs an oxidizing solution consisting typically of ferric, cupric or persalfate ions which is sprayed over an imaged laminate. In a subsequent process, copper surfaces protected by an insulating film become part of the circuitry following removal of the film by chemical dissolution.

By the nature of the hydrodynamics of the typical spraying process, the etching solution is unable to penetrate deeper into the recesses formed at levels of less than five mils in spacing. Therefore, the exchange of matter is slowed considerably so that the etching process in narrower spaces is so slow that it does not accomplish the necessary copper removal in comparision with wider spacing. These limitations in mass transport is a major limitation in spray chemical etching process.

Two approaches are known in the art. In one on these methods, the circuitry is made additive. Negative masking leaves openings for the circuitry. Bare substrate in these openings is sensitized with a palladium activator such as employed in electroless copper. Activation is followed by growth of the electroless copper to the required thickness.

Transport of matter is a limiting aspect of this process in the same manner as in the etching process. Other problems with this technique is a low rate of line formation. Problems also occur in the mechanical properties and quality of the formed copper.

Another method employed in the prior art involves electrochemically assisting the chemical etching. In this method, a positive electrical field is applied to the laminate. Electrical contact is typically made at one side of a board. As long as electrical connection is maintained, dissolution occurs both chemically and electrochemically. Problems with this method include resulting electrical discontinuities in the patterns produced.

Derek Pletcher, in his book *Industrial Electrochemistry* (Chapman & Hall 1982), mentions an electrochemical etching method for making PCBs where the laminated copper with developed photo-resist that exposes only the area to be etched is subjected to a mixture of graphite particles and sulfuric acid. The graphite particles have been previously charged by being in contact with the anode. This process, however, has not proven to be successful on a commercial scale due to the expensive etching method involving the use of graphite, its recovery, and etchants at high concentrations. In addition, this method suffers of standard problems in substrative-technology, i.e. mass transport limitations and the undercutting of the copper with dissolution propagating in all directions with equal rate.

SUMMARY OF THE INVENTION

The above chemical and electrochemical processes have several problems in achieving fine lines and spaces due to their inherent non-uniform accessibility to the varying width interstices of the fine line pattern to be formed.

The present invention provides a method and apparatus for providing fine line and spacing formations on printed circuit boards and in electronic industry in general. The invention incorporates mechanical means in the form of non-conductive or conductive fibers capable of uniformly reaching all sites at the same time. The rate of dissolution in both chemicals and electrochemical processes is uniform. Thus, the present invention is believed capable of producing spacings beyond the presently conceived practical limit of 5 mils in printed circuit boards.

My U.S. Pat. No. 4,159,923, discloses an electrically conductive brush applicator for plating a workpiece. The present invention is an extension and modification of my patent to enable the use of similar technology for printed circuit board fabrication.

The protrusion of fibers through liquid is both directional and uniform. The invention employs uniform pressure over the entire area to be treated. This results in uniformity of chemical action and of electrical field effect.

In my U.S. Pat. No. 4,159,934, a selective plating applicator is shown employing a brush used in the plating applicator. The brush includes an electrical conducting core with a plating brush attached to one end of the core. A plating current is applied to the core and a brush head comprised of anodic electrically conducting flexible fibers and electrically non-conducting flexible fibers is employed. The non-conducting fibers in the brush head are formed such that the conducting fibers will not contact the workpiece and thereby cause shorting out of the equipment and prevent electrodeposition. Various constructions are shown to accomplish this non-contacting function of the conducting fibers.

The delivery of electricity in a uniform manner has thus been demonstrated in U.S. Pat. No. 4,159,934. This method is designed for selective plating of metals. The metal to be plated is electrically connected to the negative pole of a DC supply of voltage. An apparatus which consists of a mixture of electrically conductive wires and nonconductive wires delivers the electricity in a selective-manner. The conductive and nonconductive wires are arranged in a manner of bristles in a brush. The conductive wires are shorter in length compared to the nonconductive wires. Both the conductive and nonconductive wires and joined to a common metallic stem. This metallic stem is joined electrically to the positive pole of the DC power supply. The apparatus also has proper facilities to deliver the appropriate electroplating solution to the core of the brush in such a manner that when the nonconductive wires make contact with the metal to be plated, a sufficient amount of electroplating solution becomes available in that area. When the nonconducting wires make physical contact with the metal to be plated, the conducting wires are kept at a distance from the metal but in physical contact with the electroplating solution so that an electric field can be established. The electrochemical cell formed with the positively charged metal wire from the brush, the electroplating solution and the negatively charged metal, directs the positively charged metal ions from the electroplating solution to the metal. This results in the deposition of the metal on the substrate (metal) to be plated. The total size of the metallic portion of the wire brush then dictates the area where plating deposits are formed. By moving the brush to the location where plating deposits are desired, it is possible to selectively plate the metallic substrate.

A modified concept of the above apparatus is used in the method of this invention.

In the present invention, metallic wires are attached to a hollow, cylindrical, metallic core. The metallic wires of fibers are quite fine in diameter. Space is provided in the cylindrical metallic core in the shape of perforations for the transfer of electrolyte, which is fed from the hollow inner portion of the metallic cylinder, along the metallic fibers, to the copper substrate on the laminated board.

In the method, the metallic wires or fibers are electrically connected through the metal cylinder to the positive pole (anode) of the DC power source. The metal fibers also make direct contact with the metal to be etched. Within the hollow cylinder but separated from the cylinder is positioned a perforated or mesh copper, which is connected electrically to the negative pole (cathode) of the DC power supply. A cell is now made between the copper laminate and the perforated copper inside the cylinder. Copper from the laminate (anode) is removed and deposited on the perforated copper (cathode). The action is opposite to what is accomplished in the U.S. Pat. No. 4,159,934. The metal fibers of the brush continue to make contact as the metal is grooved since the bristles are conformal in nature. The electricity to the part is turned off when the etching action is complete.

The same apparatus can be used for electroforming applications. The fibers can be connected to the negative pole of the rectifier, while an anodically insoluble conductive substrate can be used in place of the counter-electrode within the hollow cylinder. By contacting an activated or metallic substrate with negatively charged fibers one can deposit metal in the exposed areas.

The size of brush and configuration of the different elements of the brush (the fibers, cathode, cylinder size and shape of the perforations on the metallic cylinder) can be varied to suit the size and complexity of the PCB or other fine line and space application. In this method the length of the cylinder can be varied and still deliver electricity locally, due to the fibers distributing the current (field) uniformly across the entire area.

The method may also embody a processing unit in the shape of a flat processing pad. This type of apparatus has an advantage over the above-described cylindrical unit when area of several hundred square inches must be etched. For example, the pad unit can be applied over the entire area of a PCB simultaneously. Thus, the unit production is increased while the pattern accuracy is preserved.

Flowers patent, U.S. Pat. No. 2,365,529, etches a polished surface to solder stainless steel plates together. The apparatus employs an electrically conductive brush constituting a movable electrode so that the soft solder is etched with the stainless steel plates.

Brandt, et al., U.S. Pat. No. 2,590,927, FIG. 4, utilizes an electrically conducting brush having electrodes 74 embedded in the bristles thereof to remove burrs and slivers from the work face 32 of workpiece 30. The teaching of this patent is to periodically dip the brush into phosphoric acid and to manually remove burrs, etc. on the work face 32 utilizing the brush having electrical current applied thereto and to the workpiece.

Inoue, U.S. Pat. No. 3,474,013, discloses a rotating electrode constructed of conductive and insulating layers. The rotating electrode is employed to enhance the machining of a workpiece electrochemically.

Inoue, U.S. Pat. No. 4,417,962, discloses and claims an electroerosive method and apparatus employing an open-ended casing of various materials which serve as an electrode in an erosion treatment process. As taught in FIG. 4 of this patent, metal wires may be employed in one embodiment as the electroerosive electrode material.

The problem of delivering electricity to the right location in a uniform manner thus resolved, then the mass transfer and hydrodynamics of the solution can be optimized by making minor chemical corrections and controlling the dynamics of liquid. This process extends the limits achieved today by the most advanced production methods in the industry.

The process has several other advantages. In fine line and space PCB manufacturing it utilizes all the equipment that is needed for the subtractive process, up to the etching process. The chemicals used for this process are those used commercially, and thus are comparable in cost to those used in conventional subtractive methods. No extra masking steps are required. No special solution recovery system is required. The speed of execution of the technique is comparable to the conventional subtractive etching methods. In addition, the process is applicable in instances when electroforming (additive) technique may be advantageous. Also, the same generic apparatus is applicable for chemical etching.

Other examples of potential application are tape automated bonding (TAB) systems and hybrid IC circuitry, both with fine line and space requirement.

BRIEF DESCRIPTION OF THE DRAWINGS

These as well as further objects and advantages of the invention will become apparent to those skilled in the art from a review of the following detailed specification of my invention, reference being made to the accompanying drawings in which.

DETAILED DESCRIPTION OF THE INVENTION

Figure 1:
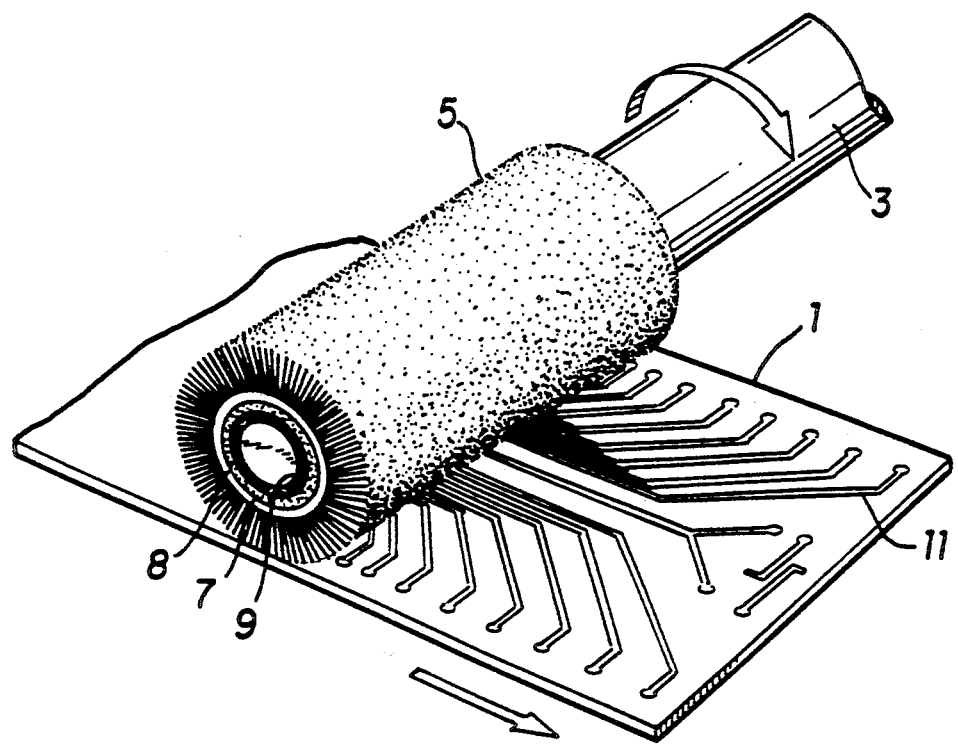
FIG. 1 is a perspective view of the brush of my invention in use over an imaged printed circuit board.

As shown in FIG. 1, a fiber brush 5 is employed in use over an imaged printed circuit board 1. The brush operates in a slowly rotating fashion at a peripheral velocity of between 0.1 and 100 centimeters per second. Fine metallic fibers of between 0.2 and 200 microns on the brush contact exposed copper areas and impose the electric field borne by the cylindrical brush design on the printed circuit board.

The fibers are in electrical contact with a perforated cylinder of the same material and represent the same electrode. This electrode is positive when the brush is being used as an etching device and is negative when the brush is used in an electroforming process.

Through the use of the brush, all the exposed copper on the printed circuit board is dissolved by etching regardless of how same is located in the pattern since the fibers of the brush come into contact with all areas on the board.

When employed in an electroforming mode, the printed circuit board has a negative photoresist pattern laid out on the board and the exposed lines are sensitized with the electroless activator. Following a brief electroless metallization step (if desired), the negatively charged brush deposits copper in a narrow line pattern faster and with greater uniformity than is obtained by the electroless process alone.

Figure 2:
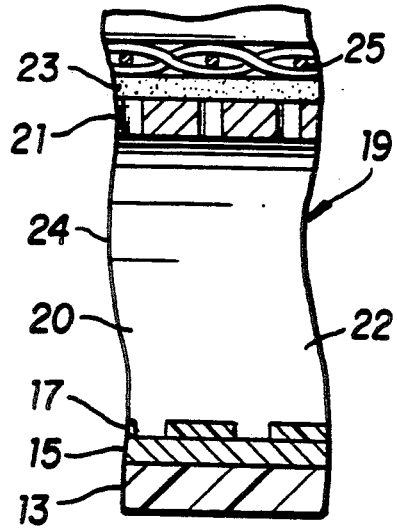
FIG. 2 is a side view of the brush employed as an etching device.
Figure 3:
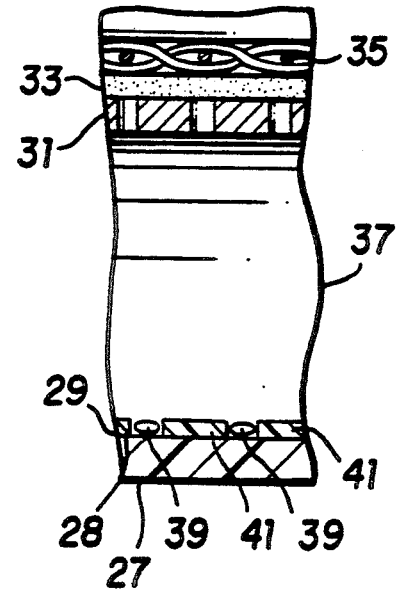
FIG. 3 is a side view of the brush employed as an electroforming device.

FIGS. 2 and 3 show the details of the brush functioning. Fibers are made of the following materials: tungsten, titanium, niobium, tantalum, graphite, platinum, rhodium and other insoluble but conductive materials like conductive ceramics, e.g. titanium oxides or, conductive plastic materials. The preferred materials are tungsten and titanium. The length of the fibers is defined by the flexibility as a function of thickness (e.g. 0.5 to 100 mm). The metallic cylinder is formed with perforations so that there is electrolytic communication to the interior of the brush cylinder. The counterelectrode, a mesh of insoluble metal, graphite or conductive ceramics when used as a cathode brush, or copper or stainless steel, when used as an anode brush, is separated from the brush via cylindrical porous separator 7. This separator, for example, may be formed of DARAMIC, sold by W. R. Grace Co. as an acid/lead battery separator.

An electric field is imposed between the two electrodes by means of a power supply (DC or pulsating current). Slip rings 55 shown in FIG. 5 connect the power to the brush. Mechanical rotation is provided via a gear system which can be operated directly or via a belt type transfer from the motor.

In use, the material of the pattern is delineated with a photographic technique applied on a layer of an insulating photosensitive plastic material. This pattern material is typically 0.5-2 mils thick. Copper areas to be removed by etching are exposed to the chemical action of liquids. These areas are also accessible to electrical contacts. In the course of the etching action, copper is removed until the insulating substrate becomes the only material present between the copper conductor lines formed in the etching process. In a fine line and fine space processing of the printed circuit board, the spaces formed by etching are 5 mils or less in width and 2-4 mils deep. The depth is a function of the film and copper sheet thickness.

Spaces designed as 2 mils or less in width are narrow gaps that are difficult to expose to any chemical or electrochemical action. The fiber brush of the present invention can now be employed. For example, ¼" fibers would have to penetrate only 2% of their length to reach the bottom of a 5-mil groove. This also requires a negligible bend on fibers which are not directly over the pattern at that instant. By providing a uniform pressure over the surface of the electronic device to be etched and providing a uniformly fibrous material over the surface etching of all areas that are exposed to the solution can be performed.

In order to provide some exchange of matter, and also to ensure that the etching proceeds preferentially in a perpendicular direction to the plane of the device, a vibratory motion is provided parallel or perpendicular to its plane. Typically, motions of less than 1 cm at speeds of less than 1 cm/sec are sufficient to provide an electrolyte supply needed for exchange of matter and yet low enough to prevent excessive lateral dissolution.

If required, directions of motion parallel or perpendicular to the plane of the electronic device can be provided depending on the design for the pattern to be used and the manufacturing apparatus to be employed. Parallel types of motion are used for low relief devices where multiplicity and uniformity of contacts can be obtained by these motions.

When applying etching solutions like $FeCl_3$, $CuCl_2$ or $NH_4S_2O_8$ their chemical activity is sufficient to generate the etching effect of exposed copper. Thus, in such instances anodic current is not needed and the pattern formation can be achieved without electricity. Fibrous brushes with metallic or nonmetallic bristles can be used in this case. In addition to the above-described conductive fibre materials the following plastic fibre material can be applied; polyester, polyacrylate, polypropylene, polyethylene, polyvinyl, polystyrene, polyphenylene sulfide, ceramic fibers and other chemically resistive materials.

In the process of chemical etching, mechanical action of the fibers results in the etchant being supplied at the site of contact and saturated solution being removed from the same site with maximum efficiency. This action is a chemical drilling effect thus forming straight walls in the channels, to ensure good electrical performance of these conductors.

For PCB manufacturing, deposits of tin, tin-lead, nickel, gold or a nickel-tin alloy or palladium or a palladium-nickel alloy are also used as an etching resistant material in a film on top of the copper substrate to protect the substrate from chemical action of the etching solutions. While exposed copper is being dissolved, the above coatings are passive and as such, protect the underlaying copper from being dissolved.

FIG. 1 shows a perspective view of the fiber brush apparatus of my invention utilized in combination with a printed circuit board. The printed circuit board 1 has various connecting lines and features 11 formed thereon. The lines and features 11 are enhanced, separated and formed by either an etching process or an electroformation process. Both processes may be employed utilizing fiber brush 5. The brush 5 is seen to be formed with a rotating handle 3 thereon coupled to the fiber brush head 5. The head is shown having three layers 7, 8, 9. Layer 7 is a separator layer, layer 9 is one electrode and layer 8 in the other electrode. Electrode 8 is coupled to the fibers of the brush head 5 as will be seen in further detail in connection with other figures discussed below.

FIG. 2 is a side view, partially in section, of the brush assembly of FIG. 1. IN FIG. 2, the two electrodes are shown at numerals 25 and 21. The electrode 25 is formed of a metallic mesh. The two electrodes are separated by separator layer 23, which may be formed of an insulator (DARAMIC).

There is attached to electrode 21 a set of brush bristles 19. The brush bristles 20, 22, 24 are formed such that the brush bristles are all of equal length. As shown in FIG. 2, the bristles are in direct physical contact with a printed circuit board 13. Specifically, printed circuit board 13 has a layer of copper laminate 15 formed thereon and a layer of photoresist positive masking 17 formed on the copper laminate 15, all in the usual fashion. The mechanical and electrical contact of the bristles of the brush when voltage is applied to the electrodes and the brush is slowly rotated in the manner which will be described in further detail below serves to etch fine lines and details in the copper through the photoresist mask.

FIG. 3 is a view similar to that shown in FIG. 2 except that the bristles on the brush 37 are used in an electroforming process. Again, two electrodes 31 and 35 are shown having separator 33 formed therebetween. Coupled to the electrode 31 is a group of bristles in a brush 37. The printed circuit board substrate is shown at 27 having photoresist mask layer 29 formed thereon. A palladium/tin activator, for example, or a thin deposit of electroless copper is formed at 28 between the substrate 27 and the mask 29. Numerals 39 denote channels or valleys in the printed circuit board mask 29. Numeral 41 denotes the spacers between the channels 39. In this embodiment, the bristles in the brush head 37 serve to deposit metal in precisely formed and closely spaced channels 39 separated by separators 41

Figure 4:
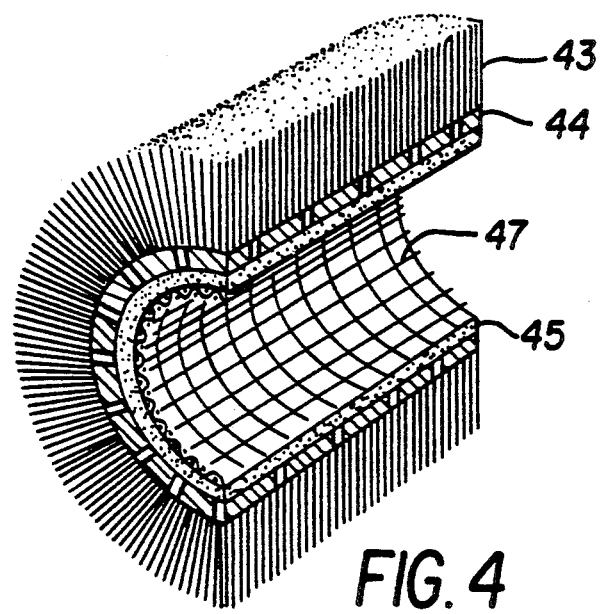
FIG. 4 is a sectional view of the brush.

FIG. 4 is a view of the brush heads previously discussed, partially in section. In FIG. 4, a plurality of bristles 43 are coupled to a metallic fiber brush cylinder 44. This cylinder 44 serves as one of the electrodes. A porous separator 45 is coupled to the brush cylinder 44. Another electrode 47 formed of mesh is connected to separator layer 45.

Figure 5:
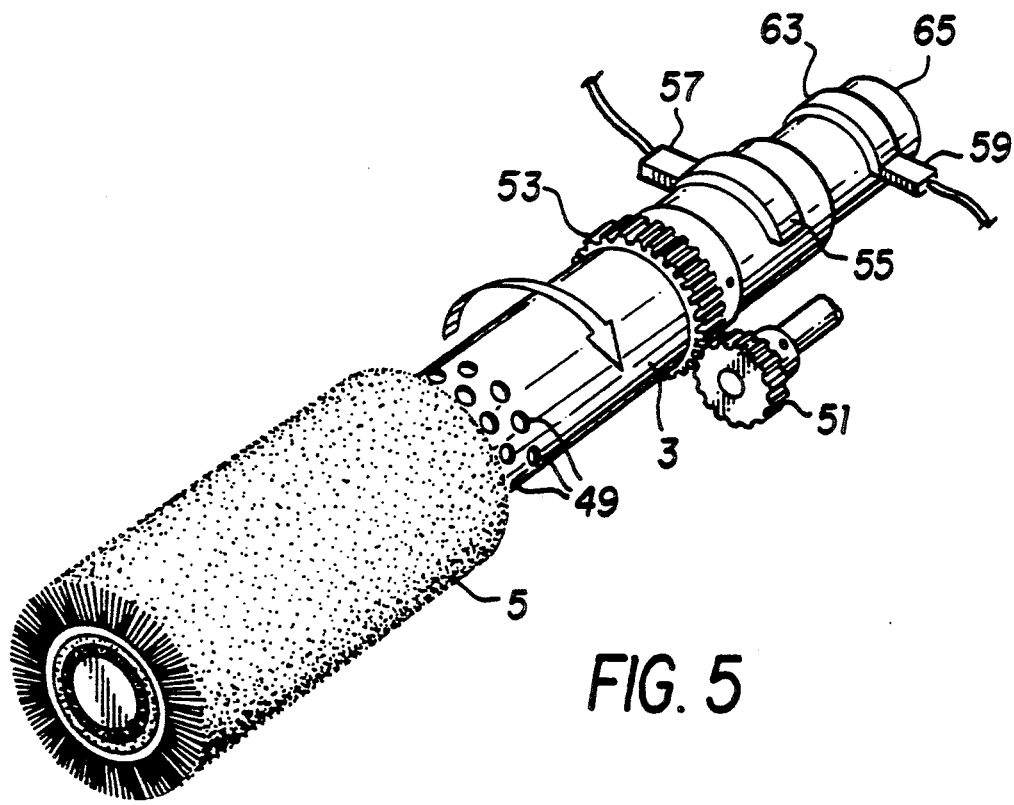
FIG. 5 is a side view of the assembly of the brush of my invention.

FIG. 5 shows shaft 3 is shown connected to a rotating mechanism and to a source of electrical power. More specifically, the brush head 5 is coupled to shaft 3 in the manner similar to the showing of FIG. 1. Numeral 49, on the handles of FIG. 3 denotes a plurality of apertures which serve to permit the flow of electrolyte therethrough. A ring gear arrangement 53,51 is connected to the handle 53 and is provided to rotate same. Two slip ring electrode mechanisms 55,57 and 59,63 are connected to the handle and to the central core 65 formed within the handle. In this manner, power from electrodes 57,61 is served to be connected to the brush. The rotating ring assembly 51,53 is provided to slowly rotate the brush over the surface of the printed circuit board.

Figure 6:
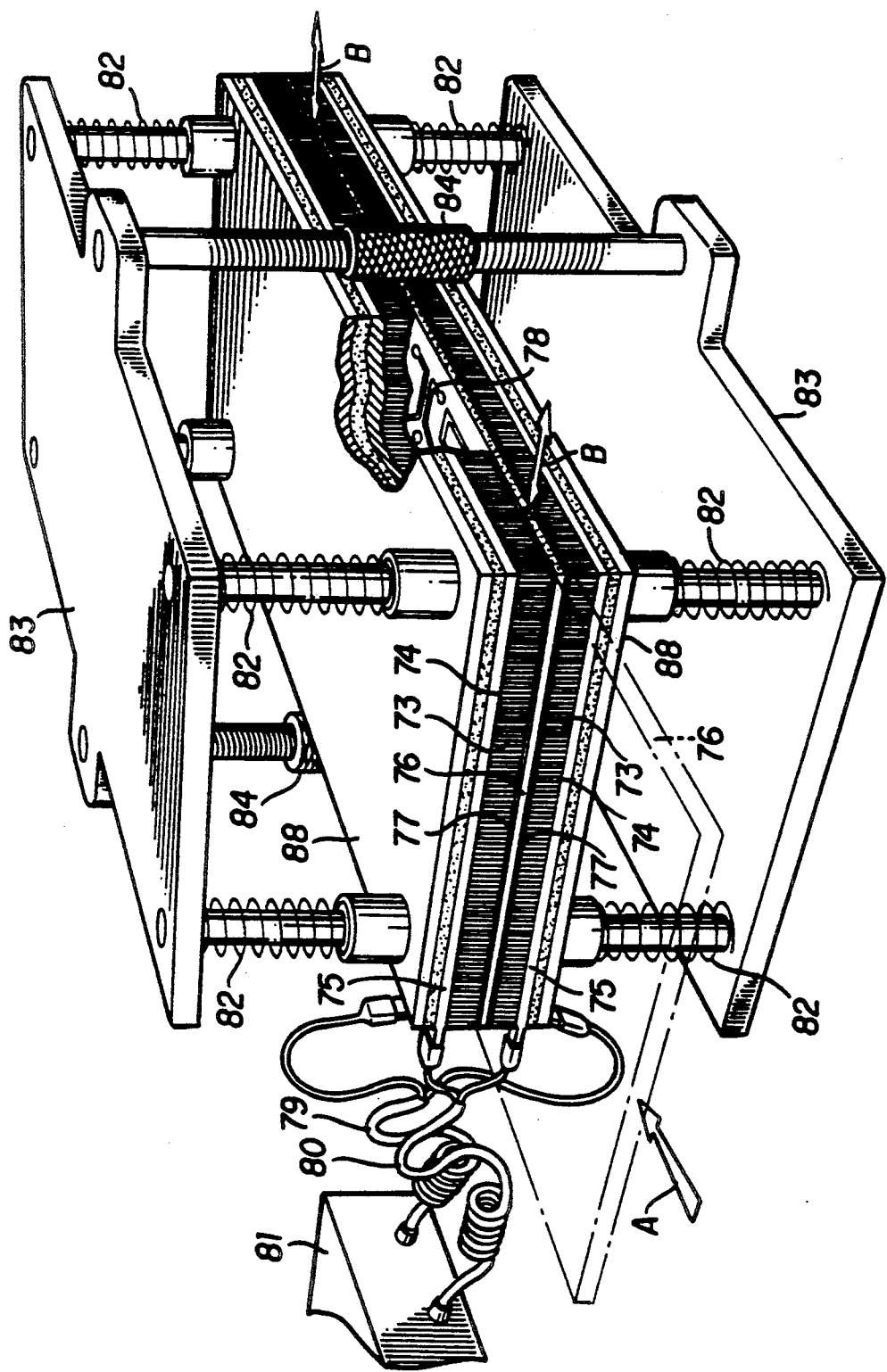
FIG. 6 is a perspective view of a flat brush modification of the invention described in FIGS. 1-5.

FIG. 6 shows the planar version of the apparatus. A plurality of bristles 73 are coupled to a foraminous substrate 75 by means of the backing material 74. Two such units sandwich a printed wiring board 76 which has two copper laminates 77 that are being etched (the example is given for the application of the apparatus for electrochemical etching of the board) to form the pattern 78. Electrical contact with the power supply 81 are made by means of the flexible contacts 79 and 80. One pole of the rectifier is attached to the foraminous substrate 75 which has the conductive junction to the backing material 74. The other pole of the rectifier is attached to the foraminous (perforated) counterelectrode 88 to enable the generation of the electric field. In order to achieve a uniform effect over the entire board area a uniform pressure must be applied. This is achieved with counterimposed springs 82 with pressure adjusting device 84. Printed wiring boards are being slowly moved through the system indicated by arrow A. Lateral or perpendicular vibrations are provided by means of the mechanical or pneumatic action indicated by arrow B.

EXAMPLE 1

Electrochemical Pattern Etching by means of TI Fibers—Cylinder

Titanium fibers 22 microns in diameter (Bekaert, Bekinox VN 22/2×275 200/TI) were attached to a titanium cylinder 2" in diameter. Fiber bundles were $\frac{1}{2}$" long and were located between perforations in cylinder wall as depicted in the attached FIG. 1. Interior portion of the cylinder was covered with "Daramic" spacer, a porous plastic used in acid batteries as a separator. The innermost position in the cylinder was occupied with a copper mesh as a counterelectrode. In contacting a PCB submerged in a solution of copper sulfate, 1.5M $CuSO_4$ plus 0.4M $H_2SO_4$, a field was generated between the copper sheet of the laminate and the inner copper mesh, positive pole of the field being the copper of the PCB and negative being the mesh. Under such conditions, all copper of the PCB in contact with the titanium fibers was dissolved while an equivalent amount of copper was deposited on the copper mesh. This was possible since titanium passivates in such conditions thus becoming electrochemically inert yet being capable of transporting the positive charge. A sample pattern was formed under such conditions after 15 minutes of DC current density of approximately 1 amp/in$^2$. A good resolution of 2 mil lines and spaces was obtained in 1.4 mil copper laminate over an FR-4 substrate.

EXAMPLE 2

Electrochemical Pattern Etching by means of Ti Fibers—Flat Brush

Titanium fibers, same as above Example 1, were used to fabricate a flat fiber brush (FIG. 6). A perforated titanium sheet was used as current collector for Ti fibers. The apparatus operated as a flat paint brush soaked with electrolyte. A sheet of "Daramic" separator was used between the counterelectrode mesh and the fibrous electrode. With a rotating motion of 1-2 r.p.s. and in circles of 2-3 mm in diameter, a pattern of lines 4 mils in thickness was obtained in 10 minutes with an approximate DC of 1 amp/in$^2$. Copper laminate was of a thickness of 1.4 mil on FR-4 substrate. Solution used in this example was $CuCl_2$, 35° Be at room temperature.

EXAMPLE 3

Chemical Pattern Etching by Means of Titanium Fibers-Flat Brush

Titanium fiber brush, FIG. 2, was used in a chemical etching process with $FeCl_3$ 42° Be at room temperature. In a similar motion as described in Example 2, a good resolution of a pattern of lines 4 mils in thickness was obtained in 10 minutes on 1 oz. copper laminate over 10 mil polyimide substrate.

EXAMPLE 4

Chemical Pattern Etching By Means of Pile Fabrics S (Velvet)—Flat Brush

Commercially available acrylic pile fabric, 2 mm thick, made with 300 denier threads containing 50 filaments, was used as the brush for etch pattern formation. In a 5 minute duration using $FeCl_3$ solution, a uniform well-defined resolution was obtained with 1 mil lines and 3 mils spaces in a 0.7 mil copper laminate.

EXAMPLE 5

Chemical Pattern Etching By Means of Pile Fabrics (Velvet)—Flat Brush

Commercially available polyester velvet, 2 mm thick, was used as the brush for etch pattern formation. A 2 oz. copper laminate over polyimide substrate was used to form patterns of 4 ml lines and 4 mil spaces. With $FeCl_3$ as etchant in 10 minutes, with rotating motion of the brush, a well-defined patter was obtained.

In all examples, given the mechanical action was uniform, the area exposed to such mechanical action was uniformly etched.

As modifications to the foregoing may be made without departing from the spirit and scope of my invention, what is sought to be protected is set forth in the appended claims.

What is claimed is:

1. Apparatus for making fine line and spacing interconnects comprising:
   a plurality of electroconductive wires;
   perforated means attached to and supporting said wires for permitting electrolyte to pass therethrough;
   first means electrically connected to said metallic wires for applying a first polarity electrical potential thereto;
   metallic means mounted in proximity to said metallic wires; and
   second means electrically connected to said metallic means for applying a second polarity electrical potential thereto.

2. The apparatus of claim 1 wherein said metallic wires are formed as a brush.

3. The apparatus of claim 2 further including means connected to said brush for moving said brush.

4. The apparatus of claim 2 wherein said brush is formed of a material selected from the group consisting of:
   tungsten, titanium, niobium, tantalum, graphite, platinum, rhuterium, iridium, rhodium, lead, silver, and alloys thereof, their oxides and conductive plastics.

5. The apparatus of claim 2 wherein said brush is formed of a material selected from the group consisting of: tungsten and titanium.

6. The apparatus of claim 1 wherein said second means includes a mesh formed of a material selected from the group consisting of: insoluble conductive materials, graphite, copper and stainless steel.

7. The apparatus of claim 1 further including porous electrical insulator separator separator means connected between said first and second means.

8. The apparatus of claim 1 further including a power supply connected to said first and second means for providing electrical energy to said apparatus.

9. Apparatus for making fine line and spacing interconnects comprising:

means for applying an electrolyte to an imaged substrate;

an electrically conductive brush including a plurality of metallic wires mounted in proximity to said image substrate;

perforated insulating means attached to and supporting said wires, said perforations permitting said electrolyte to pass therethrough;

metallic means adjacent to said insulating means for supplying an electric field for metal deposition on said imaged substrate;

first means electrically connected to said metallic wires for applying a first polarity electrical potential thereto;

second means electrically connected to said metallic means for applying a second polarity electrical potential thereto.

10. Apparatus for making fine line and spacing interconnects comprising:

means for applying an electrolyte to an imaged substate;

an electrically conductive brush including a plurality of metallic wires mounted in proximity to said imaged substrate;

perforated insulating means attached to and supporting said wires, said perforations permitting said electrolyte to pass therethrough;

metallic means attached to said insulating means for receiving metal to be removed from said imaged substrate;

first means electrically connected to said metallic wires for applying a first polarity electrical potential thereto;

second means electrically connected to said metallic means for applying a second polarity electrical potential thereto.

11. The apparatus of claim 9 or 10 further including means connected to said brush for vibrating said brush over said imaged substrate.

12. The apparatus of claim 9 or 10 further including means for applying a uniform distribution of pressure over said imaged substrate.

* * * * *